United States Patent [19]

Kessler et al.

[11] Patent Number: 5,048,065
[45] Date of Patent: Sep. 10, 1991

[54] METHOD AND CIRCUIT FOR CONTROLLING THE FREQUENCY OF AN ELECTRONIC INVERTER

[75] Inventors: Leland L. Kessler, American; David A. Fox; Kevin M. Jones, both of Shawnee, all of Ohio

[73] Assignee: Westinghouse Electric Corp., Pittsburgh, Pa.

[21] Appl. No.: 491,924

[22] Filed: Mar. 12, 1990

[51] Int. Cl.⁵ .......................................... H03B 19/00
[52] U.S. Cl. ........................................ 377/47; 328/15; 377/49; 377/50
[58] Field of Search ................ 377/47, 48, 49, 50; 328/15

[56] References Cited

U.S. PATENT DOCUMENTS

| | | | |
|---|---|---|---|
| 4,101,838 | 7/1978 | Aihara et al. | 377/50 |
| 4,184,068 | 1/1980 | Washburn | 377/47 |
| 4,573,175 | 2/1986 | Cressey et al. | 377/50 |
| 4,573,176 | 2/1986 | Yeager | 377/48 |
| 4,618,920 | 10/1986 | Fox | 377/47 |
| 4,839,603 | 6/1989 | Mower et al. | 328/15 |
| 4,851,783 | 7/1989 | Rabiger | 377/47 |

Primary Examiner—John S. Heyman
Attorney, Agent, or Firm—R. P. Lenart

[57] ABSTRACT

A method for modifying the frequency of a clock signal includes the steps of producing a clock signal having voltage pulses which occur at a first frequency and producing a control signal having voltage pulses which occur at a lower frequency. The frequency of the voltage pulses in the control signal is incremented in successive time intervals and the clock signal and control signal are combined such that one voltage pulse in the clock signal is deleted for each voltage pulse in the control signal. This results in a modified clock signal having a frequency which may be ramped up or down depending upon the initial frequency of the control signal and the direction in which the frequency of the control signal is incremented.

7 Claims, 1 Drawing Sheet

FIG. 2

METHOD AND CIRCUIT FOR CONTROLLING THE FREQUENCY OF AN ELECTRONIC INVERTER

BACKGROUND OF THE INVENTION

This invention relates to methods and circuits for controlling the frequency of clock signals and, more particularly, to such methods and circuits which are used to control the output frequency of an electronic inverter.

Constant speed drive electrical power systems which are typically found on commercial aircraft, couple an electric generator to the aircraft engine through a hydromechanical transmission which drives the generator at a constant speed to produce constant frequency output voltage. Variable speed constant frequency (VSCF) power systems include a generator which is directly coupled to the engine and therefore driven at variable speeds. The variable frequency output of this generator is electronically converted to a constant frequency output. It is desirable to retrofit existing constant speed drive equipped aircraft with variable speed constant frequency power systems. A key to successful retrofit lies in the design of a VSCF system which is directly interchangeable with existing constant speed drive systems. This precludes aircraft wiring changes or changes in any of the other system components. To accomplish this objective, the VSCF converter and its controls must be in the same package as the generator.

In a typical aircraft electrical system in which a VSCF system has replaced a constant speed drive system, the VSCF system is mounted on the engine and used to supply three phase AC power via feeder conductors to a remote load. A line contactor, located near the load, is used to disconnect the load from the feeder conductors. A remote generator control unit can be used to provide the required control of this contactor.

Inverter circuits such as those found in DC link VSCF power systems include a plurality of power pole switching elements which operate with a fixed switching pattern generated by a microprocessor or other digital circuit. A crystal oscillator is used as the frequency reference to control the output frequency of the inverter to within, for example, less than 0.05% of 400 Hz. Since the remote generator control unit typically will include underfrequency protection circuits, these circuits can be used to advantage to control the operation of the line contactor which connects the remote load to the feeder conductors. This may be accomplished by lowering the VSCF system frequency when it is necessary to open the line contactor. When the previously existing frequency sensing circuit in the remote generator control unit senses an underfrequency, it will command the line contactor to open. One technique of implementing this type of line contactor control would be to cause a step change in the output frequency of the inverter, for example, from 400 Hz to 359 Hz. However, if the VSCF system is supplying motor loads, this may result in an undesirable voltage transient. It is therefore, desirable to provide a circuit for lowering the output frequency of the inverter by ramping the frequency between two previously determined frequencies. A circuit which may be used to perform this function is disclosed in U.S. Pat. No. 4,618,920, issued Oct. 21, 1986. The circuit of that patent uses a voltage controlled oscillator to remove pulses from a high frequency clock signal in response to a control voltage which may be provided by a ramp generator. Using that technique, the low frequency point is dependent upon the accuracy and stability of the voltage controlled oscillator and its timing components. Additionally, the number of components required to implement this approach, adds to the complexity of the clock circuit.

It is therefore desirable to devise a frequency control technique which provides the required accuracy without the need for additional circuit components.

SUMMARY OF THE INVENTION

VSCF systems include a microprocessor subsystem which performs many control functions, including making the decision to change output frequency of the inverter. The present invention takes advantage of this fact and uses the microprocessor to produce a control signal that is used to modify the frequency of the clock signal.

Systems constructed in accordance with this invention provide frequency control of a clock signal by producing a clock signal having voltage pulses which occur at a first frequency and producing a control signal having voltage pulses which occur at a lower frequency. During successive time intervals, the frequency of the pulses in the control signal is changed. The clock signal and control signal are combined during the successive time intervals such that one voltage pulse in the clock signal is deleted for each voltage pulse in the control signal, thereby producing a modified clock signal.

This invention encompasses both a method of frequency control and a circuit which performs that method. In the preferred embodiment, the control signal may be generated as a software controlled output frequency of a microprocessor. Therefore, this invention can be implemented in existing VSCF control circuits without additional components.

DESCRIPTION OF THE PREFERRED EMBODIMENT

Figure 1:
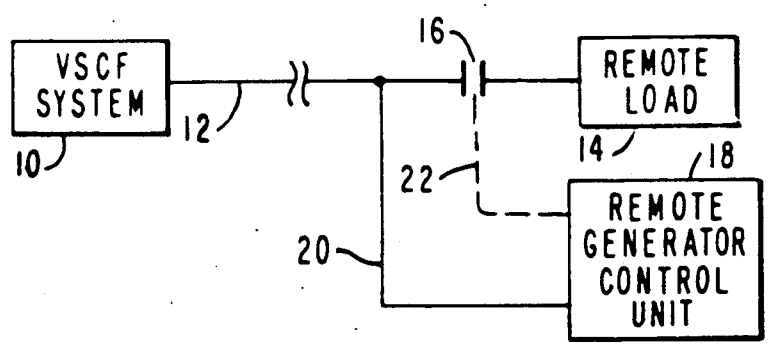
FIG. 1 is a schematic diagram of an electrical power system which may include the present invention.

Referring to the drawings, FIG. 1 is a schematic diagram of an electrical power system of the type for which the present invention was intended. A VSCF system 10 is mounted adjacent to an aircraft engine and supplies three phase AC voltage on a plurality of feeder conductors generally designated as item number 12. A remote load 14 is connected to the feeder conductors by way of a contactor 16. A remote generator control unit 18 contains an underfrequency protection circuit constructed in accordance with the prior art and senses the frequency of the voltage on the feeder conductors by way of sensing lines generally designated as item number 20. Broken line 22 indicates that the contactor contacts may be operated to open in response to an underfrequency condition sensed by the remote generator control unit.

The VSCF system 10 includes a microprocessor subsystem which has the capability of generating an output frequency that is under software control. This microprocessor subsystem performs several functions within the VSCF system by cycling through a plurality of program modules with a total loop time of, for example, 11.25 msec. Thus, the frequency of a control signal produced by this microprocessor can be incremented or decremented each 11.25 msec. If the software controlled frequency is used in place of the voltage controlled oscillator of U.S. Pat. No. 4,618,920, the output frequency can be ramped from 400 Hz to 359 Hz in ½ Hz increments in approximately 0.9 seconds. The size of the required step changes in frequency can be decreased if the time is increased.

Figure 2:
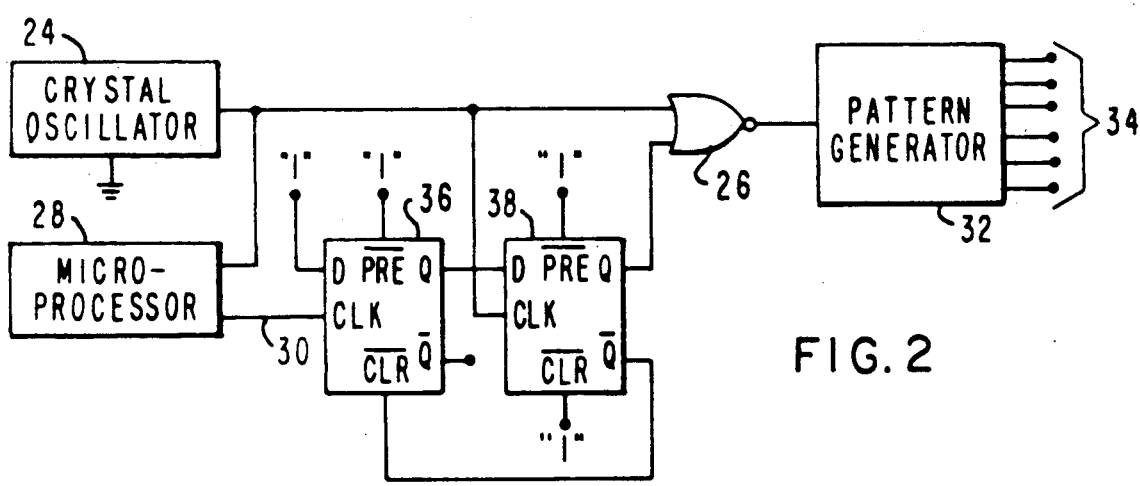
FIG. 2 is a schematic diagram of a frequency control circuit constructed in accordance with the preferred embodiment of the invention.

FIG. 2 is a schematic diagram of a circuit for controlling the frequency of the inverter output. A crystal oscillator 24 produces a series of voltage pulses which occur at a fixed frequency of, for example, 3.072 Mhz. This clock signal is delivered to an input of a NOR gate 26 and also to the clock input of a microprocessor 28. Under normal conditions, the output of the microprocessor on line 30 is a constant logic 0 and the pattern generator produces a series of voltage pulses on outputs 34 such that the output voltage of an associated inverter, not shown, is 400 Hz. In order to ramp the output frequency of the inverter from 400 Hz down to 399.5 Hz, the output of the microprocessor is programmed to be 3,840 Hz. With the type D flip flops 36 and 38 connected as shown, 3,840 pulses would be effectively stolen from the 3.072 Mhz clock signal such that 3,064,320 pulses are presented to the pattern generator each second. The pattern generator reduces 3,064,320 by 7,680 which results in an output frequency of 399.5 Hz. After one loop time of the microprocessor, for example, 11.25 msec, the frequency of the microprocessor output is incremented by 3,840 to 7,680 Hz. This process continues until the output of the microprocessor reaches 314,880 Hz which results in an output frequency of the pattern generator of 359 Hz. In order to ramp the output frequency of the pattern generator back to 400 Hz from 359 Hz, the output frequency of the microprocessor is decremented from 314,880 Hz to 0 Hz in 3,840 increments.

Figure 3:
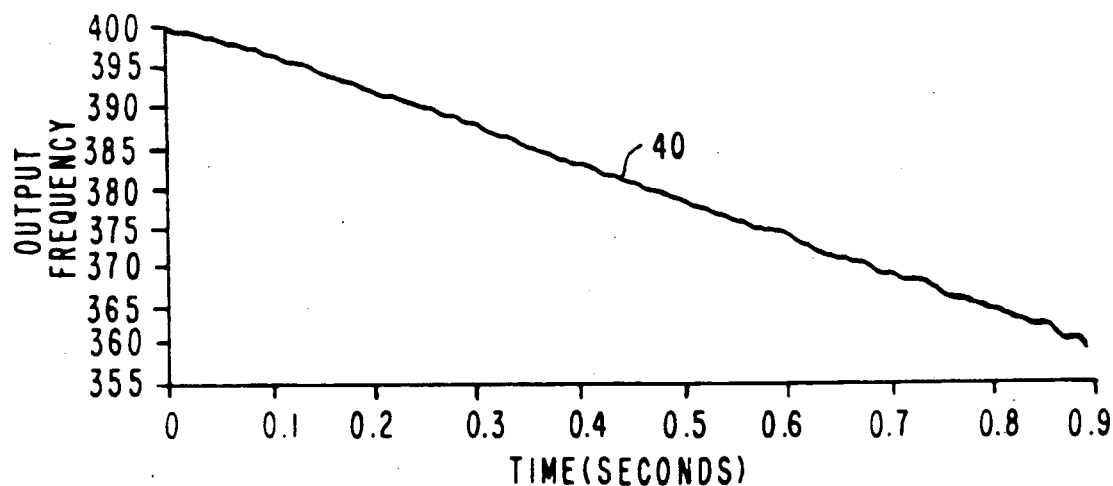
FIG. 3 is a graph which shows the output frequency of an inverter operated in accordance with the present invention.

The above example is an idealized illustration of the frequency control technique of this invention without considering hardware limitations. However, interval timers used in typical microprocessor subsystems can only divide the clock signal by integers. A typical interval timer, the 82C54-2, has a clock limitation of 10 Mhz. Therefore, the ideal incrementing of the output frequency of the microprocessor must be modified to account for the hardware limitations. FIG. 3 is a plot showing the actual output frequency which would occur if a 10 Mhz interval timer is assumed to be incremented by 3,840 Hz each 11.25 Ms. Although the frequency illustrated by line number 40 is substantially linear with respect to time from 400 Hz to 359 Hz, some nonlinearity is introduced by the hardware limitations. Up to 0.68 seconds, the actual output frequency would be decremented by the desired 0.5 Hz. After 0.776 seconds, the actual output departs from the ideal because of the limitation of dividing by integers. Even though the frequency decrements are not equal, the frequency steps are small enough to prevent objectionable voltage transients. The use of an interval timer having a higher maximum clock speed would improve the linearity of the output frequency.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A frequency control circuit comprising:
    means for producing a clock signal having a plurality of voltage pulses which occur at a first frequency;
    means for producing a control signal having a plurality of voltage pulses which occur at a frequency lower than said first frequency, and for changing the frequency of said voltage pulses in said control signal at the end of each of a plurality of time intervals; and
    means for combining said clock signal with said control signal after each of said time intervals, such that one of said voltage pulses in said clock signal is deleted for each of said voltage pulses in said control signal, thereby producing a modified clock signal.

2. A frequency control circuit as recited in claim 1, wherein said means for producing a control signal comprises:
    a microprocessor connected to receive said clock signal and programmed to divide the frequency of pulses in said clock signal by an integer following each of said time intervals to produce said control signal.

3. A method for modifying the frequency of a clock signal, said method comprising the steps of:
    producing a clock signal having a plurality of voltage pulses which occur at a first frequency;
    producing a control signal having a plurality of voltage pulses which occur at a frequency lower than said first frequency;
    changing the frequency of said voltage pulses in said control signal at the end of each of a plurality of time intervals; and
    combining said clock signal with said control signal after each of said time intervals, such that one of said voltage pulses in said clock signal is deleted for each of said voltage pulses in said control signal, thereby producing a modified clock signal.

4. A method for modifying the frequency of a clock signal, as recited in claim 3, wherein said step of producing a control signal comprises the step of:
    dividing the frequency of pulses in said clock signal by an integer following each of said time intervals to produce said control signal.

5. A method for modifying the frequency of a clock signal, as recited in claim 3, wherein the frequency of said control signal is increased after each of said time intervals in said changing step.

6. A method for modifying the frequency of a clock signal, as recited in claim 3, wherein the frequency of said control signal is decreased after each of said time intervals in said changing step.

7. A method for modifying the frequency of a clock signal, as recited in claim 3, wherein the frequency of said modified clock signal is substantially linear with respect to time.

* * * * *